United States Patent [19]
Feller et al.

[11] Patent Number: 5,700,383
[45] Date of Patent: Dec. 23, 1997

[54] SLURRIES AND METHODS FOR CHEMICAL MECHANICAL POLISH OF ALUMINUM AND TITANIUM ALUMINIDE

[75] Inventors: A. Daniel Feller; Kenneth C. Cadien, both of Portland, Oreg.

[73] Assignee: Intel Corporation, Santa Clara, Calif.

[21] Appl. No.: 577,243

[22] Filed: Dec. 21, 1995

[51] Int. Cl.$^6$ .................. C23F 3/00; C23F 1/44
[52] U.S. Cl. .................. 216/88; 216/89; 216/100; 216/102; 216/103; 216/104; 216/108; 216/109; 156/636.1; 156/652.1; 156/345; 252/79.1; 106/3; 51/308; 437/228
[58] Field of Search .................. 216/88, 89, 100, 216/102, 103, 104, 108, 109; 156/636.1, 645.1, 345 LP, 652.1; 437/228; 252/79.1; 51/308; 106/3

[56] References Cited

U.S. PATENT DOCUMENTS

| | | | |
|---|---|---|---|
| H125 | 9/1986 | Nordquist, Jr. | 216/88 |
| T105,402 | 5/1985 | Basi et al. | 252/79.1 |
| 2,828,193 | 3/1958 | Newman | 216/104 |
| 3,385,682 | 5/1968 | Lowen | 252/79.1 |
| 3,557,000 | 1/1971 | Smith | 216/103 |
| 3,779,839 | 12/1973 | Kaihu et al. | 216/104 |
| 4,297,436 | 10/1981 | Kubotera et al. | 216/66 |
| 4,725,375 | 2/1988 | Fujii et al. | 252/79.4 |
| 4,728,456 | 3/1988 | Yamasoe et al. | 216/104 |
| 4,956,015 | 9/1990 | Okajima et al. | 51/308 |
| 4,956,313 | 9/1990 | Cote et al. | 216/89 |
| 4,959,113 | 9/1990 | Roberts | 216/89 |
| 5,084,071 | 1/1992 | Nenadic et al. | 51/308 |
| 5,137,544 | 8/1992 | Medellin | 51/308 |
| 5,209,816 | 5/1993 | Yu et al. | 156/636.1 |
| 5,225,034 | 7/1993 | Yu et al. | 156/636.1 |
| 5,227,016 | 7/1993 | Carlson et al. | 216/103 |
| 5,228,886 | 7/1993 | Zipperian | 51/308 |
| 5,318,927 | 6/1994 | Sandhu et al. | 437/228 |
| 5,340,370 | 8/1994 | Cadien et al. | 216/89 |
| 5,374,328 | 12/1994 | Remba et al. | 156/628 |
| 5,391,258 | 2/1995 | Brancaleoni et al. | 216/89 |
| 5,407,526 | 4/1995 | Danielson et al. | 156/636.1 |
| 5,527,423 | 6/1996 | Neville et al. | 156/636.1 |
| 5,540,810 | 7/1996 | Sandhu et al. | 156/636.1 |

FOREIGN PATENT DOCUMENTS

| | | |
|---|---|---|
| 53-125936 | 11/1978 | Japan . |
| 1208091 | 1/1986 | U.S.S.R. . |
| 1629353 | 8/1988 | U.S.S.R. . |

OTHER PUBLICATIONS

Kaufman, et al., "Chemical–Mechanical Polishing for Fabricating Patterned W Metal Features as Chip Interconnects", *J. Electrochem. Soc.*, vol. 138, No. 11., Nov. 1991.

*Primary Examiner*—R. Bruce Breneman
*Assistant Examiner*—Anita Alanko
*Attorney, Agent, or Firm*—Blakely, Sokoloff, Taylor & Zafman

[57] ABSTRACT

Slurries and methods for the chemical mechanical polishing of thin films used in integrated circuit manufacturing are described. A first slurry comprises an oxidant, such as water, a halogen, such as fluorine, an abrasive, such as silica, and a chelating agent, such as citric acid, and has a pH between four and nine. The first slurry is ideal for the chemical mechanical polish of an aluminum film. Another slurry comprises an abrasive, such as silica, and an acid, such as citric acid, and has a pH of approximately three. The second slurry is ideal for the chemical mechanical polish of titanium aluminide and is compatible with the first slurry.

42 Claims, 5 Drawing Sheets

DIAGRAM IS FOR ALUMINUM WITH AN OXIDE FILM OF HYDROGILLITE ($Al_2O_3$, $3H_2O$) AT 25 °C (77 °F). POTENTIAL VALUES ARE FOR THE STANDARD HYDROGEN ELECTRODE SCALE.

SLURRIES AND METHODS FOR CHEMICAL MECHANICAL POLISH OF ALUMINUM AND TITANIUM ALUMINIDE

FIELD OF THE INVENTION

The present invention relates to the field of integrated circuit manufacturing, and more specifically, to the process of chemically mechanically polishing thin films.

BACKGROUND OF THE INVENTION

Figure 1A:
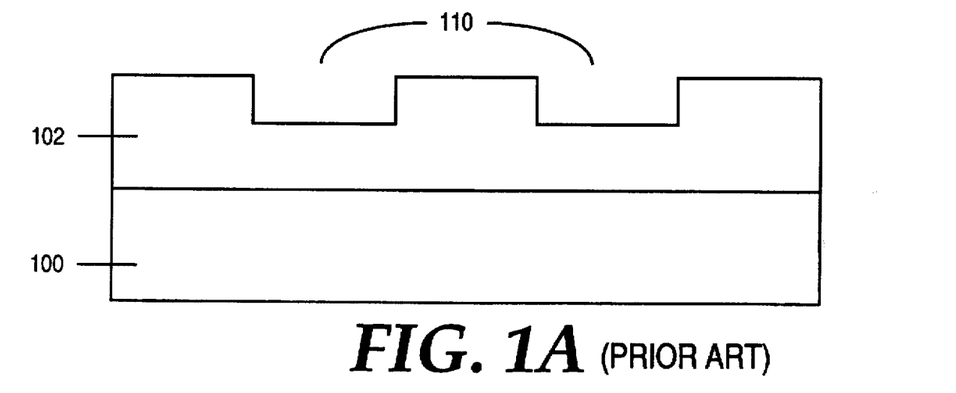
FIG. 1a is an illustration of a cross sectional view showing trenches in an insulating layer over a silicon substrate.
Figure 1B:
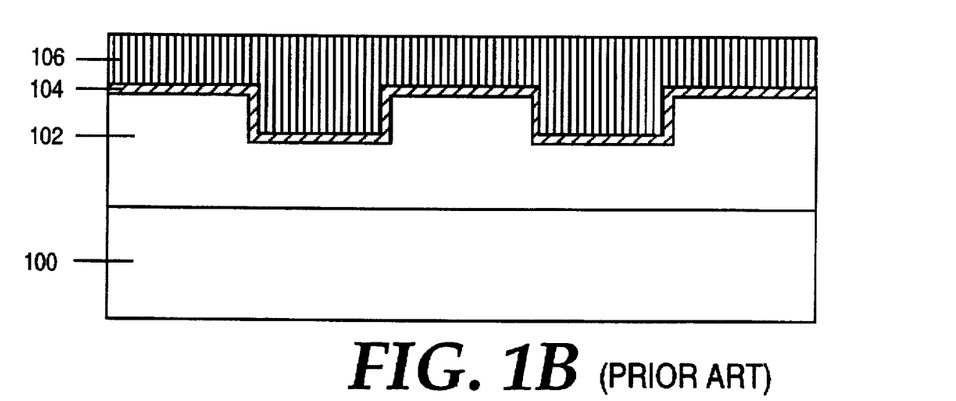
FIG. 1b is an illustration of a cross sectional view showing the trenches of FIG. 1a after the blanket deposition of titanium and aluminum.
Figure 1C:
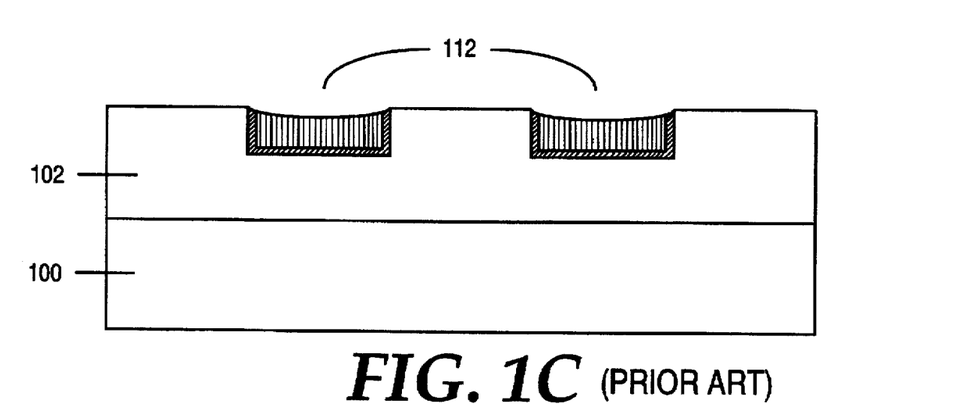
FIG. 1c is an illustration of a cross sectional view showing the metal lines that have been formed in the trenches after completion of a CMP step.

Chemical mechanical polishing (CMP) techniques are used in the semiconductor industry to remove thin films from the surface of semiconductor substrates. One common use of these techniques is to form metal interconnect lines, vias, or contacts by (a) patterning and etching trenches or holes in an insulating layer, (b) depositing a blanket of metal, and (c) chemically mechanically polishing away the metal lying over the insulating layer. FIGS. 1a to 1c illustrate the formation of aluminum interconnect lines using this process.

FIG. 1a shows the cross sectional view of two trenches 110 that have been patterned and etched into an insulating layer 102. The insulating layer 102 lies over a silicon substrate 100. FIG. 1b shows the trenches 110 after the blanket deposition of a barrier layer of titanium 104 and a layer of aluminum 106. FIG. 1c shows the cross sectional view of two interconnect lines 112 that have been formed after the CMP step is complete.

Figure 2:
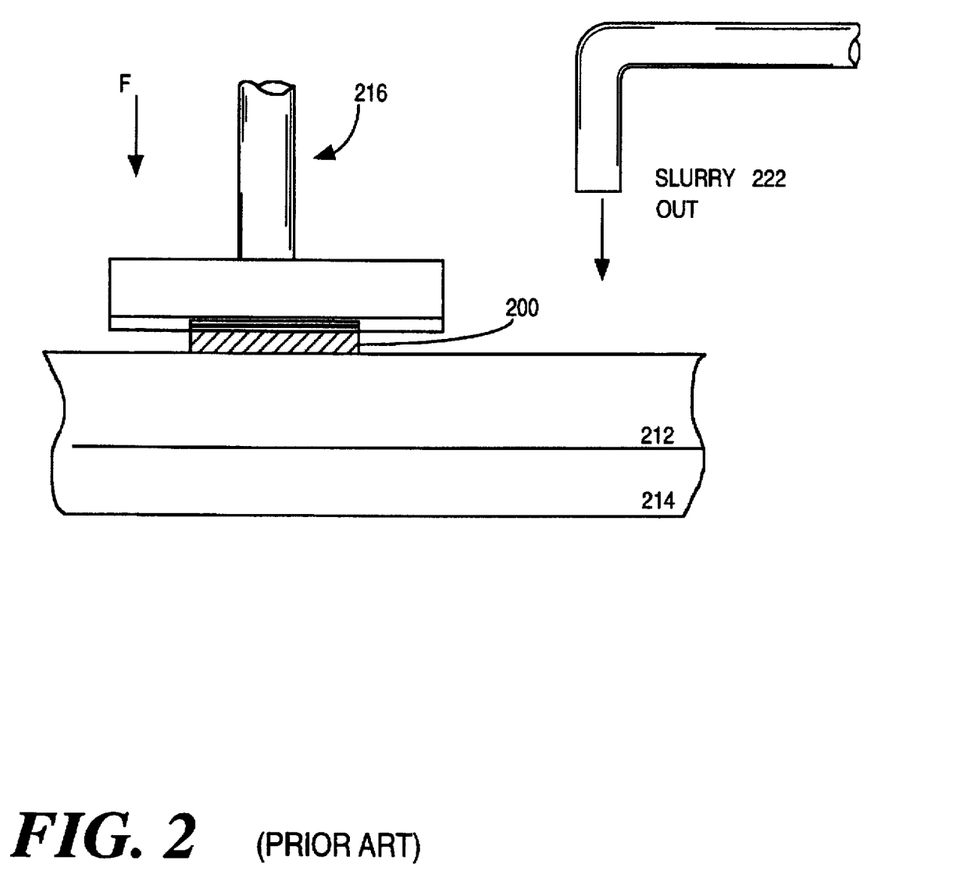
FIG. 2 is an illustration of the apparatus of the CMP step.

The apparatus of a typical CMP step is illustrated in FIG. 2. The substrate wafer 200 is placed face down on a polishing pad 212 which is attached to a rotating table 214. In this way, the thin film to be polished is placed in direct contact with the pad 212. A carrier 216 is used to apply a downward pressure F against the backside of the substrate wafer 200. During the polishing process, the table 214 and pad 212 are rotated while an chemically reactive and abrasive solution, commonly referred to as a "slurry" 222, is pumped onto the surface of the pad 212.

The slurry 222 facilitates the polishing process by chemically reacting with the thin film and by providing an abrasive material to remove the thin film while the table 214 rotates. Slurry composition is an important factor in the manufacturability of the process.

One prior slurry for the removal of aluminum is reported in U.S. Pat. No. 5,209,816, Method of Chemical Mechanical Polishing Aluminum Containing Layers and Slurry for Chemical Mechanical Polishing. This slurry contains phosphoric acid as the chemical reactant and alumina as the abrasive material. The addition of hydrogen peroxide, to oxidize the aluminum, was found to increase the removal rate from approximately 700 angstroms per minute to 2500 angstroms per minute. One disadvantage of this slurry is that it has a pH under four. This disadvantage is shared by other prior art aluminum slurries, such as that reported in U.S. Pat. No. 4,944,836, Chem-Mech Polishing Method for Producing Coplanar Metal/Insulator Films on a Substrate.

Figure 3:
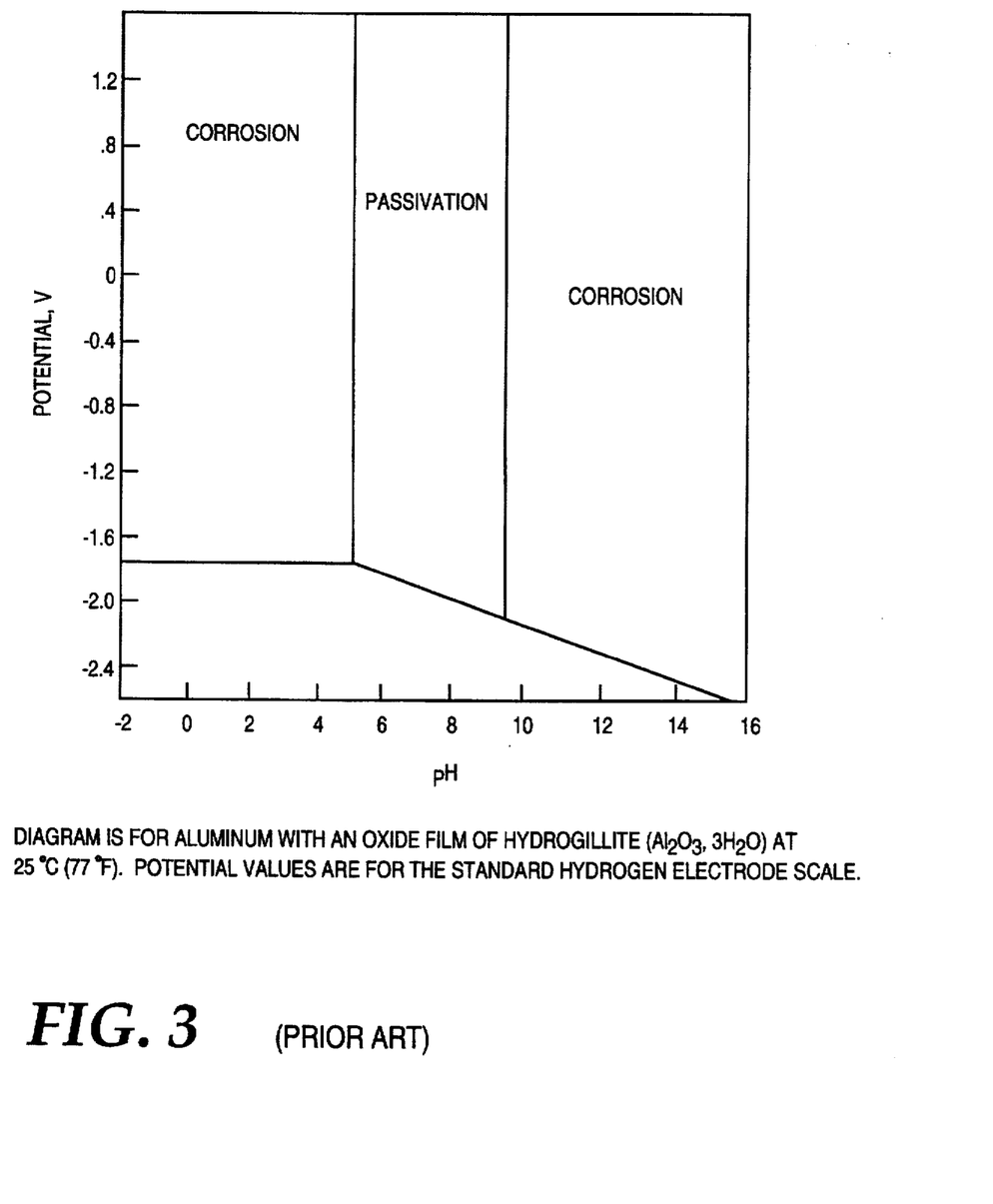
FIG. 3 is a Pourbaix diagram for aluminum.

An aluminum slurry with a pH under four is undesirable because of the relationship between pH and corrosion. FIG. 3 is a Pourbaix diagram which shows the corrosion and passivation ranges for aluminum. At a pH below four, corrosion is favored over passivation. If the pH of the slurry is in the corrosion range, the surface of the aluminum is unprotected by a native oxide and is subject to corrosion. This corrosion leads to recessing of the metal line or via below the surface of the insulating layer, as shown in FIG. 1c. The recessing creates nonplanarities which propagate to subsequent layers and impair the ability to print narrow, high density lines on those layers. The corrosion may also affect the integrity of the metal lines or vias formed during the CMP step, presenting reliability problems.

SUMMARY OF THE INVENTION

Slurries and methods for the chemical mechanical polishing of thin films used in integrated circuit manufacturing are described. A first slurry comprises an oxidant, such as water, a halogen, such as fluorine, an abrasive, such as silica, and a chelating agent, such as citric acid, and has a pH between four and nine. The first slurry is ideal for the chemical mechanical polish of an aluminum film. Another slurry comprises an abrasive, such as silica and an acid, such as citric acid, and has a pH of approximately three. The second slurry is ideal for the chemical mechanical polish of titanium aluminide and is chemically compatible with the first slurry.

DETAILED DESCRIPTION OF A PREFERRED EMBODIMENT

Novel slurries and methods for the chemical mechanical polish (CMP) of thin films used in the manufacture of integrated circuits are described. In the following description numerous specific details are set forth, such as specific machinery, materials, and thicknesses, in order to provide a thorough understanding of the present invention. It will be obvious, however, to one skilled in the art that the present invention may be practiced without these specific details. In other instances, other well known processes and machinery have not been described in particular detail in order to avoid unnecessarily obscuring the present invention.

The novel slurries and CMP process of the present invention are preferably used to form metal interconnect lines on an integrated circuit. The slurries and methods can also be used to form via connections or plugs between conductive layers of an integrated circuit. The teachings of the present invention, however, can be applied to other processes in the manufacture of integrated circuits including, but not limited to, planarization of various layers. In fact, the teachings of the present invention can be applied to CMP processes used in areas other than integrated circuit manufacturing.

Figure 4A:
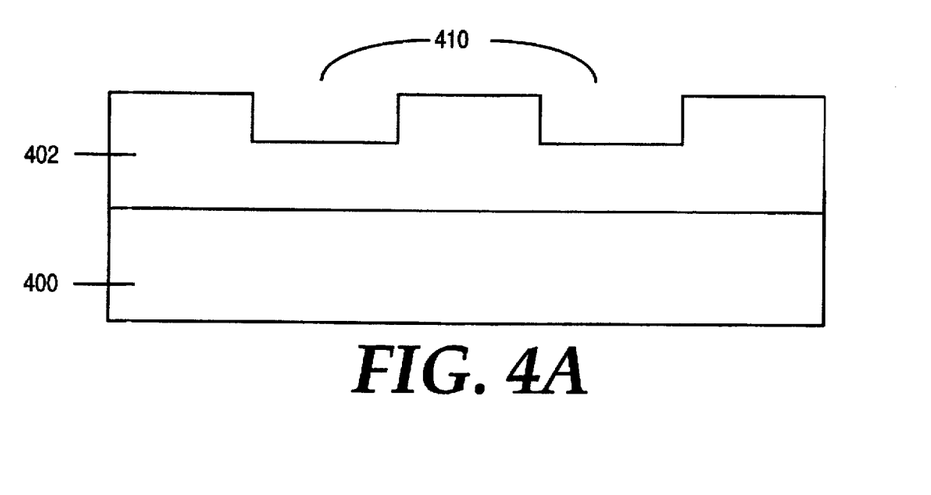
FIG. 4a is an illustration of a cross sectional view of trenches in an insulating layer over a silicon substrate.
Figure 4B:
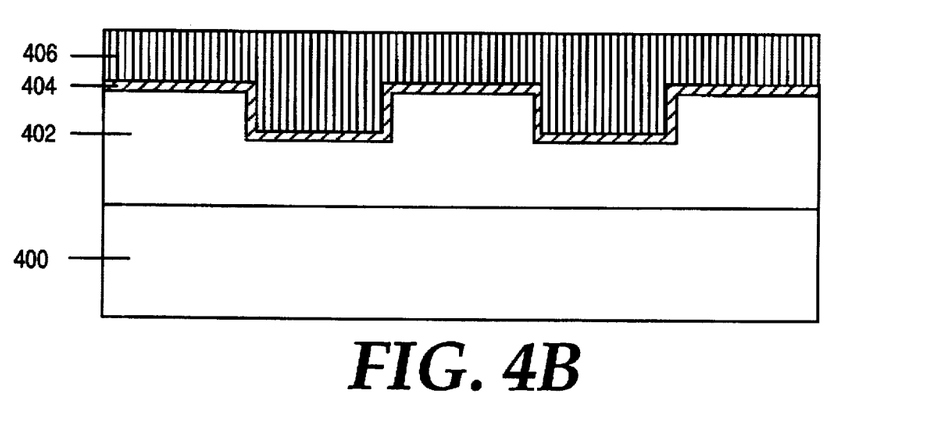
FIG. 4b is an illustration of a cross sectional view of the trenches of FIG. 4a after the blanket deposition of titanium and aluminum.
Figure 4C:
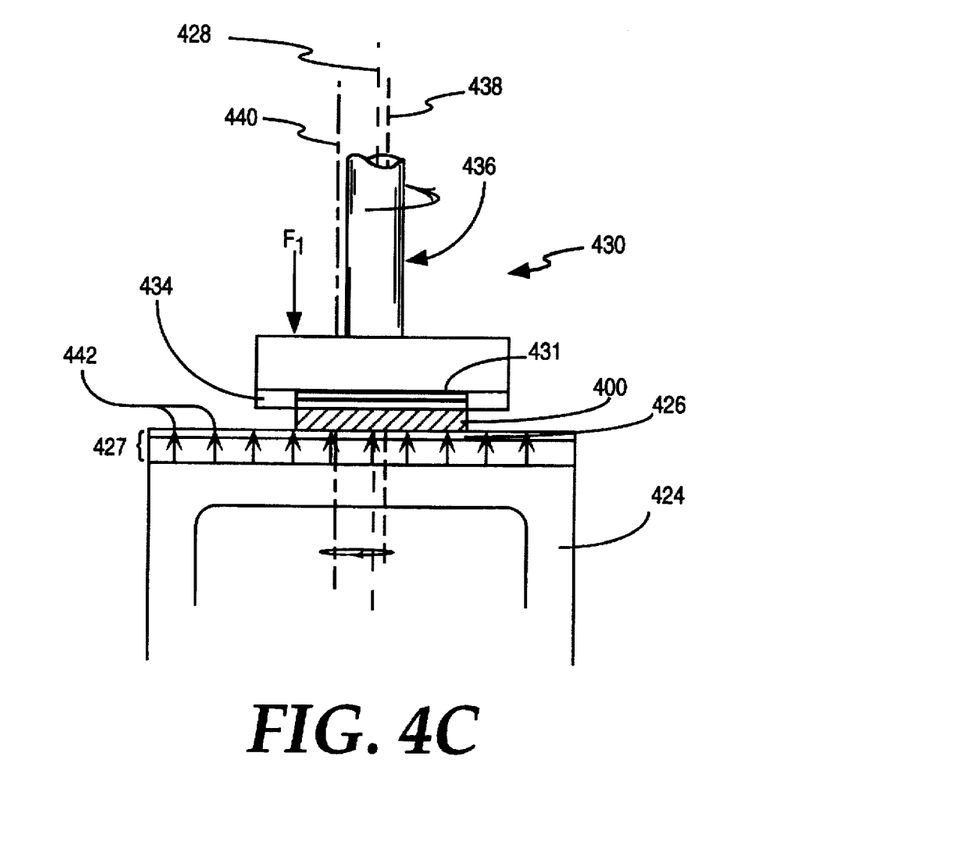
FIG. 4c is an illustration of the apparatus of the CMP step used in the preferred embodiment of the present invention.

FIGS. 4a to 4c illustrate the formation of metal interconnect lines with a CMP step using the slurries of the present invention. The interconnect lines are formed over a substrate 400. The substrate is preferably a silicon wafer, but can be another semiconductor such as gallium arsenide or germanium, or can also be some other material which is not a semiconductor such as ceramic. An insulating layer 402 lies over the substrate. Various layers, not shown, may lie between the substrate 400 and the insulating layer 402. These layers might include lower levels of metallization, gate electrodes, isolation regions, capacitors, or other features. The insulating layer 402 is generally an undoped silicon dioxide, a phosphosilicate glass, or a borophosphosilicate glass formed by chemical vapor deposition (CVD). Other insulating layers, such as silicon nitride, or multilayer composite dielectrics, including such substances as spin on glass, may also be used. The function of the insulating layer 402 is to electrically isolate the subsequently formed interconnect lines from any underlying conductive layer. The insulating layer 402 can be formed by techniques well known in the art.

First, trenches 410 are formed in the insulating layer 402. A photoresist layer is formed over the insulating layer 402 which is then masked, exposed, and developed with techniques well known in the art, to define locations for the trenches 410. The insulating layer 402 is then etched with techniques well known in the art, such as reactive ion etch, to form trenches 410. The trenches 410 of the preferred embodiment are 6,000 angstroms deep.

Next, a barrier layer is blanket deposited over the insulating layer 402. The function of the barrier layer is to prevent spiking of the subsequently deposited aluminum layer into contacts to any underlying conductive layers. In the preferred embodiment of the present invention, a titanium layer is blanket deposited over the top surface of insulating layer 402, and on the sides and top of the insulating layer 402 in the trenches 410. The titanium layer is not shown in FIG. 4b, because it is subsequently consumed in a reaction with aluminum to form a titanium aluminide layer 404. The titanium layer is formed to a thickness of approximately 250 angstroms by well known means, such as sputtering or CVD. Other substances, such as titanium tungsten or titanium nitride, may be used instead of or in addition to titanium, and for additional or alternative reasons, such as to promote adhesion between layers.

Next, an aluminum layer 406 is blanket deposited over the titanium layer using well known means such as sputtering or CVD. The deposition forms an aluminum layer to a thickness of approximately 10,000 angstroms, and completely fills trenches 410 with aluminum. In order to obtain proper fill of trenches 410 the aluminum is heated to at least 400 degrees C. At this temperature, the titanium reacts with the aluminum to form titanium aluminide. The titanium aluminide layer 404 is formed in this manner to a thickness of approximately 750 angstroms.

Next, aluminum layer 406 and titanium aluminide layer 404 are chemically mechanically polished back to form metal interconnect lines. For this purpose, the apparatus shown in FIG. 4c is used in the preferred embodiment. This apparatus is described in the copending U.S. patent application entitled Orbital Motion Chemical Mechanical Polishing Method and Apparatus, with Ser. No. 08/103,412 and assigned to the present assignee. Other similar apparatus, such as that shown in FIG. 2, can also be used.

Substrate 400 is placed face down on a polishing pad 426 of pad assembly 427 which is fixedly attached to the upper surface of a table 424. In this way the thin film to be polished is placed in direct contact with the upper surface of pad 426. The polishing process is facilitated by uniformly distributing slurry at the substrate/pad interface while pad 426 orbits about a fixed point 428 and substrate 400 rotates counter clockwise about its center 438. Polishing is continued in this manner until the desired amount of thin film is removed.

To facilitate polishing, a shaft 436 attached to carrier 430 can be used to apply a downward pressure $F_1$ to the backside of substrate 400. A pressure of three to four psi is used in the preferred embodiment. The backside of substrate 400 can be held in contact with carrier 430 by a vacuum or simply by wet surface tension. Preferably an insert pad 431 cushions substrate 400 from carrier 430. An ordinary retaining ring 434 can be employed to prevent substrate 400 from slipping laterally from beneath carrier 430 during processing.

To facilitate uniformity of polishing, the center 440 of table 424 and pad 426 orbits clockwise about a fixed point 428, with a radius of the orbit that is less than the radius of the substrate 400. The center 438 of substrate 400 is offset from the center 440 of pad 426 and from the axis of orbit 428. A rate of orbit of 240 rpm is used in the preferred embodiment.

So that the slurry is delivered adequately and uniformly across the substrate/pad interface, the slurry is fed through a plurality of equally spaced holes 442 formed through polish pad 426. Polish pad 426 may be hard or soft. In the preferred embodiment, a soft Rodel Politex Supreme pad is used.

The key to obtaining good and manufacturable CMP results in the present invention are the novel slurries. The slurry used for polishing the aluminum layer 406 is a two source slurry with a pH between four and nine. The first source comprises an oxidant and a halogen, and is preferably a halide ion in an aqueous solution. The second source comprises an abrasive and a chelating agent, and preferably also comprises a buffering system.

The oxidant in the first source oxidizes the surface of the aluminum film to form aluminum oxide. Since a native oxide forms on an aluminum film in the presence of water, no further oxidant is required in an aqueous solution. If desired, an oxidant such as hydrogen peroxide can be added, but plain water is preferred for lower cost and longer shelf life.

The halogen in the first source dramatically increases the rate of removal of the aluminum oxide by creating a pitting potential between the oxide surface and the aqueous solution. The pits that are formed in the oxide weaken the oxide to facilitate oxide removal by mechanical abrasion, and the pits also provide for increased penetration of the chemical reactants through the oxide to the aluminum. The preferred halogen in the first source is fluorine. Other halogens such as chlorine, bromine, or iodine can be used if desired. Fluorine is preferred because fluorine is highly reactive with aluminum oxide and is commonly used in integrated circuit processing. Because fluorine is commonly used, its effects are well known and appropriate waste treatment equipment is already in place.

The fluorine in the first source is preferably from a fluoride salt such as potassium fluoride or sodium fluoride. Potassium fluoride is preferred because potassium does not present a risk of mobile ion contamination. A potassium fluoride concentration above 0.1 molar is desired to ensure that a sufficient amount of fluorine is available at the surface of the thin film. A potassium fluoride concentration below 1 molar is desired to keep cost and waste down. A 0.5 molar solution of potassium fluoride is used in the preferred embodiment.

The abrasive in the second source facilitates the mechanical removal of the thin film. Silica is the preferred abrasive, because it is softer than alternatives such as alumina and will create less scratching. Cabot Semi-Sperse™-25 silica is used in the preferred embodiment, but other silica or non-silica based abrasives, such as alumina or ceria, can be used. More than one half percent (0.5%) by weight of silica is preferred to provide a sufficiently high rate of aluminum removal. Less than three percent (3%) by weight of silica is preferred to ensure controllability of the polish and to keep costs down. The second source of the aluminum slurry of the preferred embodiment comprises one percent (1%) by weight of silica.

The chelating agent in the second source facilitates removal of metal ions. Citric acid is the preferred chelating agent because, compared to the alternatives, it is a better chelator and poses less of an environmental risk. Alternative chelating agents, such as oxalic or ascorbic acid, can be used if desired.

The pH of the aluminum slurry is maintained using a buffering system. A slurry with a pH in the passivation range is preferred, so that the surface of the aluminum is passivated with a native oxide that protects the vias and interconnects from being etched after the aluminum polish is complete. The passivation range for aluminum is between a pH of four and nine, as shown in FIG. 3. If the pH of the slurry is outside of the passivation range the aluminum is corroded rather than passivated. Corrosion of the aluminum can lead to excessive via recessing and trench dishing.

The buffering system of the preferred embodiment comprises citric acid and potassium citrate. This buffering system is preferred because citric acid is the preferred chelating agent of the aluminum slurry. A buffering system with a different chelating agent, such as oxalic or ascorbic acid, or a buffering system without a chelating agent, such as acetic acid and potassium citrate, could be used if desired. In the preferred embodiment, the concentrations of citric acid and potassium citrate are high enough to maintain the pH, but low enough to ensure solubility and keep costs down. Preferred concentrations are between 0.1 molar and 1 molar for acetic acid, and between 0.1 molar and 1 molar for potassium citrate. The second source of the aluminum slurry of the preferred embodiment comprises 28.5 grams per liter of citric acid and 16.2 grams per liter of potassium citrate, to maintain the pH of the aluminum slurry between 5.5 and 6.0. A pH between 5.5 and 6.0 is preferred because it provides margin between the operating point and the high end of the passivation range, and margin between the operating point and the low end of the passivation range.

The two sources in the aluminum slurry are preferably mixed at the point of use, that is, immediately before delivery to the substrate/pad interface. If there is a significant delay between the time that the sources are mixed and the time that the slurry is delivered to the interface, hydrofluoric acid can be formed from fluoride ions from the first source and hydrogen ions from the second source. The hydrofluoric acid can then dissolve the silica in the second source. Point of use mixing is preferably achieved using a CMP slurry delivery and mixing system such as that disclosed in U.S. Pat. No. 5,407,526, Chemical Mechanical Polishing Slurry Delivery and Mixing System. It is to be appreciated that other slurry delivery systems, including those that do not provide for point of use mixing, can also be used within the scope of the present invention.

After mixing of the first and second source, the aluminum slurry of the preferred embodiment comprises 0.25 molar potassium fluoride, 0.5% by weight silica, 14.25 grams per liter citric acid, and 8.1 grams per liter potassium citrate.

The preferred composition of the novel aluminum slurry exhibits many qualities that make the CMP process extremely manufacturable. Aluminum removal rates as high as 3500 angstroms per minute have been achieved without excessive scratching, via recessing, or trench dishing. The high removal rate allows good wafer throughput. The polish removal rate is also very uniform with less than ten percent deviation over a three sigma range. It is to be noted that reproducibility of results can depend on other factors in addition to slurry composition, such as pad type, polish pressure, and pad orbit rate.

The polishing of aluminum layer 406 is continued in the above manner until substantially all of the aluminum on top of titanium aluminide layer 404 is removed. Next, titanium aluminide layer 404 is polished. The polish of titanium aluminide layer 404 is preferably accomplished using the same method and apparatus that is used for the polish of aluminum layer 406, with a different slurry. The substrate 400 remains in contact with pad 426. The rotational motion of substrate 400 and the orbital motion of pad 426 continue. The novel slurry of the present invention ideal for polishing titanium aluminide is delivered to the substrate/pad interface.

The novel titanium aluminide slurry is comprised of an abrasive and an acid and has a pH between two and four. To facilitate the transition from the aluminum slurry to the titanium aluminide slurry, the titanium aluminide slurry is preferably comprised of the same abrasive as that used in the aluminum slurry, and the same acid as that in the buffering system of the aluminum slurry. Therefore, the preferred abrasive is silica and the preferred acid is citric acid. This chemical compatibility between the aluminum slurry and the titanium aluminide slurry allows for the titanium aluminide polish to continue on the same equipment as the aluminum polish with no need to change polish pad 426. It also improves manufacturing efficiency because fewer chemicals are required in inventory.

It is to be appreciated that alternative chemicals can be used in the titanium aluminide slurry to maintain chemical compatibility to the aluminum slurry. For example, if the abrasive in the aluminum slurry is alumina, then alumina can be used in the titanium aluminide slurry. Likewise, if the acid in the aluminum slurry is oxalic acid, then oxalic acid can be used in the titanium aluminide slurry. Also, it is to be appreciated that if chemical compatibility is not desired, the titanium aluminide slurry can be comprised of an abrasive or an acid not found in the aluminum slurry.

The abrasive in the titanium aluminide slurry facilitates the mechanical removal of the thin film. Silica is the preferred abrasive in the titanium aluminide slurry, because it is softer than alternatives such as alumina and will create less scratching. Cabot Semi-Sperse™-25 silica is used in the preferred embodiment of the titanium aluminide slurry, but other silica or non-silica based abrasives, such as alumina or ceria, can be used. More than one half percent (0.5%) by weight of silica is preferred to provide a sufficiently high rate of aluminum removal. Less than three percent (3%) by weight of silica is preferred to ensure controllability of the polish and to keep costs down. The titanium aluminide slurry of the preferred embodiment comprises two percent (2%) by weight of silica.

The acid in the titanium aluminide slurry maintains the pH between two and four. A slurry with a pH less than two would be considered a hazardous material and would require special handling which would increase manufacturing costs. A slurry with a pH above four would have remove the insulating layer at a higher rate than desired. The preferred embodiment of the titanium aluminide slurry comprises 1.5 grams per liter of citric acid to maintain the pH of the slurry at approximately three.

The acid in the titanium aluminide slurry is preferably a chelating agent, such as citric acid, oxalic acid, or ascorbic acid. If the acid is a chelating agent it will facilitate the removal of metal ions. Citric acid is the preferred chelating agent because, compared to the alternatives, it is a better chelator and poses less of an environmental risk. If desired, an acid that is not a chelating agent, such as acetic acid, can be used.

The titanium aluminide slurry of the preferred embodiment provides a high removal rate of the titanium aluminide relative to the insulating layer and the remaining aluminum. This high selectivity to titanium aluminide permits an overpolish to be used to ensure complete removal of the titanium aluminide without excessive removal of the insulating layer or of the aluminum remaining as interconnect lines.

Figure 4D:
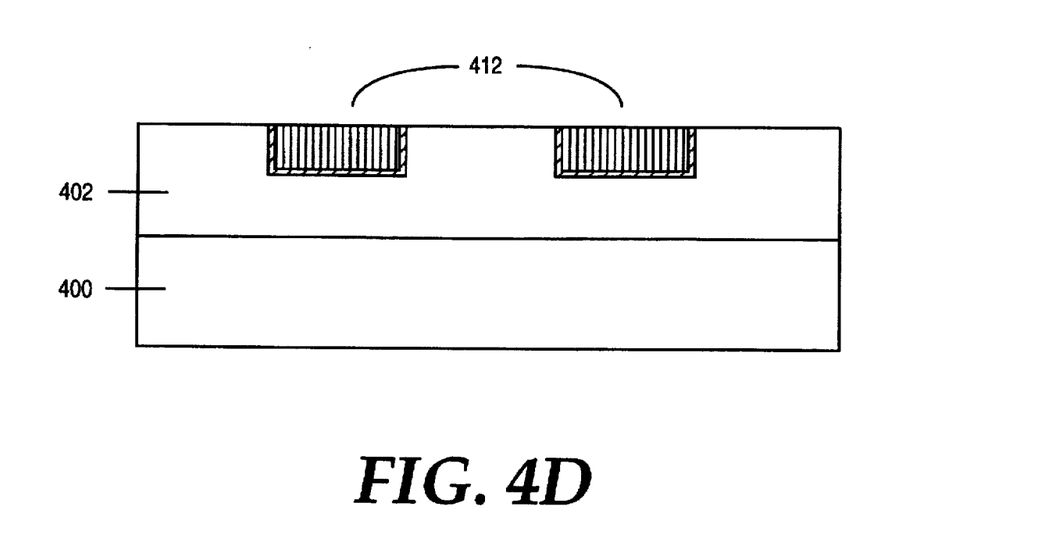
FIG. 4d is an illustration of a cross sectional view of the metal lines that have been formed in the trenches after completion of a CMP step using the present invention.

The polishing of titanium aluminide layer 404 is continued in the above manner until all of the titanium aluminide on top of insulating layer 402 is removed. The formation of interconnect lines 412 using the preferred embodiment of the present invention is now complete. The top surface of interconnect lines 412 is substantially planar with the top surface of the insulating layer. This planarity is beneficial to the processing of subsequently formed layers, facilitating the printing of narrow, high resolution lines and the formation of metal features with good step coverage.

It is to be appreciated that the novel slurries and methods of the present invention can be used to to form features other than interconnect lines. For example, the present invention can be used to form vias or electrical connections to the metal interconnect lines formed as described above. First, the planar interconnect layer formed as described above is covered with an insulating layer. Holes are then etched through this insulating layer in locations where the electrical connections to the metal interconnect lines are desired. Next, a blanket deposition of metal fills the holes in the insulating layer. Finally, the CMP process of the present invention can be used to remove the blanket of metal, leaving metal plugs where the electrical connections are desired.

In the preceding specification, specific details such as slurry chemistries, film compositions, and equipment parameters have been included to best describe the preferred embodiment. The present invention is not limited by these details, and various changes to these details are possible within the scope of the present invention. The specification and drawings must be regarded in an illustrative rather than a restrictive sense. The scope of the present invention is is intended to be defined by the claims which follow.

What is claimed is:

1. A method of polishing comprising the steps of:
   placing a metal surface in contact with a polishing pad;
   delivering a slurry comprising an oxidant, a halogen, an abrasive, and a chelating agent to said metal surface; and
   chemically mechanically polishing said metal surface with said slurry.

2. The method of claim 1 wherein said slurry has a pH greater than four and less than nine.

3. The method of claim 1 wherein said oxidant is water.

4. The method of claim 1 wherein said halogen is fluorine.

5. The method of claim 1 wherein said abrasive is silica.

6. The method of claim 1 wherein said chelating agent is citric acid.

7. A method of polishing comprising the steps of:
   placing a surface comprising aluminum in contact with a polishing pad;
   delivering to said surface a slurry comprising an oxidant, a halogen, an abrasive, and a chelating agent; and
   chemically mechanically polishing said surface with said slurry.

8. A method of polishing a thin film, said method comprising the steps of:
   placing a metal surface comprising aluminum in contact with a polishing pad;
   delivering a slurry comprising water, potassium fluoride, silica, and citric acid to said metal surface; and
   chemically mechanically polishing said metal surface with said slurry.

9. The method of claim 8 wherein said slurry has a pH greater than four and less than nine.

10. A method of polishing comprising:
    placing a substrate having two layers of metal formed thereon in contact with a polishing pad, wherein said two layers of metal comprise a first layer comprising aluminum and a second layer comprising titanium;
    delivering a first slurry comprising an oxidant, a halogen, an abrasive, and an acid to said polishing pad, said polishing pad in contact with the first layer;
    removing said first layer from said substrate by chemical mechanical polishing using said first slurry;
    delivering a second slurry comprising said abrasive and said acid, to said polishing pad, said polishing pad in contact with the second layer; and
    removing said second layer from said substrate by chemical mechanical polishing using said second slurry.

11. The method of claim 10 wherein said first slurry has a pH greater than four and less than nine.

12. The method of claim 10 wherein said oxidant is water.

13. The method of claim 10 wherein said halogen is fluorine.

14. The method of claim 10 wherein said abrasive is silica.

15. The method of claim 10 wherein said acid is a chelating agent.

16. A method of polishing comprising:
    placing a surface comprising titanium aluminide in contact with a polishing pad;
    delivering to said surface a slurry having a pH greater than two and less than four and comprising silica and an acid, said acid being a chelating agent; and
    chemically mechanically polishing said surface with said slurry.

17. The method of claim 16 wherein said slurry comprises:
    approximately 2% silica by weight; and
    approximately 1.5 grams per liter citric acid;
    wherein said slurry has a pH of approximately three.

18. A method of forming interconnect lines in an integrated circuit comprising the steps of:
    forming a trench in an insulating layer;
    forming a titanium layer on said insulating layer and in said trench;

forming an aluminum layer on said titanium layer, converting said titanium layer to a titanium aluminide layer;

chemically mechanically polishing said aluminum layer with a slurry comprising an oxidant, a halogen, an abrasive, and a chelating agent; and chemically mechanically polishing said titanium aluminide layer with a slurry comprising said abrasive and said chelating agent.

19. The method of claim 18 wherein said slurry has a pH greater than four and less than nine.

20. The method of claim 18 wherein said oxidant is water.

21. The method of claim 18 wherein said halogen is fluorine.

22. The method of claim 18 wherein said abrasive is silica.

23. The method of claim 18 wherein said chelating agent is citric acid.

24. The method of claim 19 wherein said oxidant is water, said halogen is fluorine, said abrasive is silica, and said chelating agent is citric acid.

25. The method of claim 24 wherein the fluorine is from potassium fluoride at a concentration greater than 0.05 molar and less than 0.5 molar.

26. The method of claim 24 wherein the concentration of silica is greater than 0.25% and less than 1.5% by weight.

27. The method of claim 24 further comprising potassium citrate.

28. The method of claim 27 wherein the concentration of citric acid is greater than 0.05 molar and less than 0.5 molar, and the concentration of potassium citrate is greater than 0.05 molar and less than 0.5 molar.

29. A method of forming electrical connections to a conductive layer of an integrated circuit comprising the steps of:

forming said conductive layer;

forming an insulating layer on said conductive layer;

forming holes in said insulating layer;

forming a titanium layer on said insulating layer and in said holes;

forming an aluminum layer on said titanium layer, converting said titanium layer to a titanium aluminide layer;

chemically mechanically polishing said aluminum layer with a slurry comprising an oxidant, a halogen, an abrasive, and a chelating agent; and chemically mechanically polishing said titanium aluminide layer with a slurry comprising said abrasive and said chelating agent.

30. The method of claim 29 wherein said slurry has a pH greater that four less than nine.

31. The method of claim 29 wherein said oxidant is water.

32. The method of claim 29 wherein said halogen is fluorine.

33. The method of claim 29 wherein said abrasive is silica.

34. The method of claim 29 wherein said chelating agent is citric acid.

35. The method of claim 29 wherein said oxidant is water, said halogen is fluorine, said abrasive is silica, and said chelating agent is citric acid.

36. The method of claim 35 wherein the fluorine is from potassium fluoride at a concentration greater than 0.05 molar and less than 0.5 molar.

37. The method of claim 35 wherein the concentration of silica is greater than 0.25% and less than 1.5% by weight.

38. The method of claim 35 further comprising potassium citrate.

39. The method of claim 38 wherein the concentration of citric acid is greater than 0.05 molar and less than 0.5 molar, and the concentration of potassium citrate is greater than 0.05 molar and less than 0.5 molar.

40. A slurry for chemically mechanically polishing a metal comprising:

an oxidant;

a halogen;

an abrasive; and a chelating agent;

wherein said slurry has a pH greater than four and less than nine.

41. The slurry of claim 40 wherein said oxidant is water, said halogen is fluorine, said abrasive is silica, and said chelating agent is citric acid.

42. A two source slurry for chemically mechanically polishing a metal comprising aluminum, wherein the first source comprises:

water; and approximately 0.5 molar potassium fluoride;

and the second source comprises:

approximately 1% silica by weight;

approximately 30 grams per liter citric acid; and approximately 15 grams per liter potassium citrate;

wherein said slurry has a pH between 5.5 and 6.0.

* * * * *